(12) United States Patent
Wang et al.

(10) Patent No.: US 9,979,410 B2
(45) Date of Patent: May 22, 2018

(54) SMART VOLTAGE REGULATION TECHNIQUES

(71) Applicant: Taiwan Semiconductor Manufacturing Co., Ltd., Hsin-Chu (TW)

(72) Inventors: Ruopeng Wang, Hsin-Chu (TW); Alan Roth, Leander, TX (US); Eric Soenen, Austin, TX (US); Alan Drake, Round Rock, TX (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 20 days.

(21) Appl. No.: 15/205,158

(22) Filed: Jul. 8, 2016

(65) Prior Publication Data

US 2017/0063231 A1 Mar. 2, 2017

Related U.S. Application Data

(60) Provisional application No. 62/212,874, filed on Sep. 1, 2015.

(51) Int. Cl.
*G05F 1/56* (2006.01)
*H03M 1/12* (2006.01)
(Continued)

(52) U.S. Cl.
CPC .............. *H03M 1/12* (2013.01); *G05F 1/56* (2013.01); *G05F 1/12* (2013.01); *H02M 3/156* (2013.01)

(58) Field of Classification Search
CPC ... G05F 1/10; G05F 1/267; G05F 1/46; G05F 1/561; G05F 1/567; G05F 1/569;
(Continued)

(56) References Cited

U.S. PATENT DOCUMENTS

| 2012/0062192 | A1  | 3/2012 | Okuma |        |
|--------------|-----|--------|-------|--------|
| 2014/0002044 | A1* | 1/2014 | Babazadeh | ......... H02M 3/1588 323/282 |
| 2014/0035548 | A1* | 2/2014 | Oaklander | ........... H03K 17/063 323/283 |

OTHER PUBLICATIONS

Dongsheng & Rajdeep "Enabling power efficient DVFS operations on silicon", IEEE Circuits and systems magazine 2009.
(Continued)

*Primary Examiner* — Timothy J Dole
*Assistant Examiner* — Bryan R Perez
(74) *Attorney, Agent, or Firm* — Eschweiler & Potashnick, LLC

(57) ABSTRACT

The present disclosure relates to voltage regulation techniques. In some embodiments, a voltage regulator is configured to regulate an output voltage based on a reference voltage. The voltage regulator comprises an analog-to-digital converter, an encoder, a decoder and a power stage. The analog-to-digital converter receives the reference voltage and an output voltage of the voltage regulator and provides a digital error signal. The encoder is coupled to the analog-to-digital converter output and configured to provide a multi-bit digital control signal based upon a present value of the digital error signal, a plurality of pre-determined coefficients, and a plurality of previous values of the digital error signal. The decoder is coupled to the encoder and configured to generate a plurality of control signals based on the multi-bit digital control signal. The power stage comprises a plurality of power cells which are coupled to a power supply and which receive the plurality of control signals, respectively.

20 Claims, 4 Drawing Sheets

(51) Int. Cl.
 *G05F 1/12* (2006.01)
 *H02M 3/156* (2006.01)

(58) Field of Classification Search
 CPC ........ G05F 1/571; G05F 1/573; G05F 1/5735;
 G05F 1/461; G05F 1/462; G05F 1/463;
 G05F 1/465; G05F 1/466; G05F 1/467;
 G05F 1/56; G05F 1/562; G05F 1/563;
 G05F 1/565; G05F 1/575; G05F 1/577;
 G05F 1/585; G05F 1/59; G05F 1/595;
 G05F 1/607; G05F 1/61; G05F 1/613;
 G05F 1/614; G05F 1/618; G05F 1/62;
 G05F 1/66; G05F 1/08; G05F 1/153;
 G05F 1/16; G05F 1/26; G05F 1/34; G05F
 3/02; G05F 3/30; G05F 3/22; G05F
 3/222; G05F 3/242; G05F 3/225; G05F
 3/245; G05F 3/20; G05F 3/00; G05F
 3/08; G05F 3/10; G05F 3/16; G05F 3/18;
 G05F 3/185; G05F 3/227; G05F 3/247;
 G05F 3/26; G05F 3/265; G05F 3/24;
 G05F 3/262
 See application file for complete search history.

(56) References Cited

OTHER PUBLICATIONS

Okuma, et. al. 0.5-V Input Digital Low-Dropout Regulator (LDO) with 98.7% Current Efficiency in 65 nm CMOS IEICE Trans. Electron., vol. E94-C, No. 6, Jun. 2011.

\* cited by examiner

| Clock cycle | Ratio of Vfb:Vref minus 1 | Present Digital Error Signal 107a | signal from C0 (present error * 65) from 130a | signal from C1 (previous error * 20) from 130b | signal from C2 (previous'' error'' * 12) from 130c | signal from C3 (previous''' error''' * 12) | signal from C4 (previous'''' error'''' * 2) | signal from C5 (previous''''' error''''' *1) from 130n | output of encoding unit 115 | multi-bit digital control signal 111 |
|---|---|---|---|---|---|---|---|---|---|---|
| 1 | 0.4000 | 1 | 65 | 0 | 0 | 0 | 0 | 0 | 65 | 65 |
| 2 | 0.4584 | 1 | 65 | 20 | 0 | 0 | 0 | 0 | 85 | 115 |
| 3 | 0.5142 | 1 | 65 | 20 | 12 | 0 | 0 | 0 | 33 | 143 |
| 4 | 0.5683 | 1 | 65 | 20 | 12 | 12 | 0 | 0 | 21 | 164 |
| 5 | 0.6209 | 1 | 65 | 20 | 12 | 12 | 2 | 0 | 19 | 183 |
| 6 | 0.6729 | 1 | 65 | 20 | 12 | 12 | 2 | 1 | 18 | 201 |
| 7 | 0.7241 | 1 | 65 | 20 | 12 | 12 | 2 | 1 | 18 | 219 |
| ... | ... | ... | ... | ... | ... | ... | ... | ... | ... | ... |
| 44 | 0.0457 | 1 | 65 | 20 | 12 | 12 | 2 | 1 | 18 | 885 |
| 45 | 0.0171 | 1 | 65 | 20 | 12 | 12 | 2 | 1 | 18 | 903 |
| 46 | -0.0118 | -1 | -65 | 20 | 12 | 12 | 2 | 1 | -112 | 791 |
| 47 | -0.0327 | -1 | -65 | -20 | 12 | 12 | 2 | 1 | -72 | 719 |
| 48 | -0.0485 | -1 | -65 | -20 | -12 | 12 | 2 | 1 | -48 | 671 |
| 49 | -0.0603 | -1 | -65 | -20 | -12 | -12 | 2 | 1 | -24 | 647 |
| 50 | -0.0712 | -1 | -65 | -20 | -12 | -12 | -2 | 1 | -20 | 627 |
| ... | ... | ... | ... | ... | ... | ... | ... | ... | ... | ... |
| 69 | -0.0371 | -1 | -65 | -20 | -12 | -12 | -2 | -1 | -18 | 285 |
| 70 | -0.0256 | -1 | -65 | -20 | -12 | -12 | -2 | -1 | -18 | 267 |
| 71 | -0.0134 | -1 | -65 | -20 | -12 | -12 | -2 | -1 | -18 | 249 |
| 72 | -0.0004 | -1 | -65 | -20 | -12 | -12 | -2 | -1 | -18 | 231 |
| 73 | 0.0133 | 1 | 65 | -20 | -12 | -12 | -2 | -1 | 112 | 343 |
| 74 | 0.0196 | 1 | 65 | 20 | -12 | -12 | -2 | -1 | 72 | 415 |
| ... | ... | ... | ... | ... | ... | ... | ... | ... | ... | ... |
| 80 | 0.0015 | 1 | 65 | 20 | 12 | 12 | 2 | 1 | 18 | 561 |
| 81 | -0.0055 | -1 | -65 | 20 | 12 | 12 | 2 | 1 | -117 | 443 |
| 82 | -0.0052 | -1 | -65 | -20 | 12 | 12 | 2 | 1 | -72 | 377 |
| 83 | -0.0005 | -1 | -65 | -20 | -12 | 12 | 2 | 1 | -48 | 329 |
| 84 | 0.0071 | 1 | 65 | -20 | -12 | -12 | 2 | 1 | 106 | 435 |
| 85 | 0.0078 | 1 | 65 | 20 | -12 | -12 | -2 | 1 | 70 | 505 |
| 86 | 0.0041 | 1 | 65 | 20 | 12 | -12 | -2 | -1 | 48 | 553 |
| 87 | -0.0025 | -1 | -65 | 20 | 12 | 12 | -2 | -1 | -106 | 447 |
| 88 | -0.0022 | -1 | -65 | -20 | 12 | 12 | 2 | -1 | -70 | 377 |
| 89 | 0.0024 | 1 | 65 | -20 | -12 | 12 | 2 | 1 | 82 | 459 |
| 90 | 0.0018 | 1 | 65 | 20 | -12 | -12 | 2 | 1 | 66 | 525 |
| 91 | -0.0029 | -1 | -65 | 20 | 12 | -12 | -2 | 1 | -84 | 441 |
| 92 | -0.0023 | -1 | -65 | -20 | 12 | 12 | -2 | -1 | -66 | 375 |
| 93 | 0.0025 | 1 | 65 | -20 | -12 | 12 | 2 | -1 | 84 | 459 |
| 94 | 0.0018 | 1 | 65 | 20 | -12 | -12 | 2 | 1 | 66 | 525 |
| 95 | -0.0029 | -1 | -65 | 20 | 12 | -12 | -2 | 1 | -84 | 441 |
| 96 | -0.0023 | -1 | -65 | -20 | 12 | 12 | -2 | -1 | -66 | 375 |
| 97 | 0.0025 | 1 | 65 | -20 | -12 | 12 | 2 | -1 | 84 | 459 |
| 98 | 0.0018 | 1 | 65 | 20 | -12 | -12 | 2 | 1 | 66 | 525 |
| 99 | -0.0029 | -1 | -65 | 20 | 12 | -12 | -2 | 1 | -84 | 441 |
| 100 | -0.0023 | -1 | -65 | -20 | 12 | 12 | -2 | -1 | -66 | 375 |

Fig. 3

SMART VOLTAGE REGULATION TECHNIQUES

REFERENCE TO RELATED APPLICATION

This Application claims priority to U.S. Provisional Application No. 62/212,874 filed on Sep. 1, 2015, the contents of which is hereby incorporated by reference in its entirety.

BACKGROUND

Modern system on chip (SoC) design strives to reduce manufacturing cost and power consumption. A smart power delivery network plays a role to reducing manufacturing cost and power consumption. A SoC circuit usually includes several subsystems of different device functionalities integrated on a single chip, which are powered at different voltage and current domains. To power those subsystems using a single power supply, for example, a battery of a smart phone, voltage regulators are needed. A voltage regulator converts a supply voltage to one or more target operation voltages.

BRIEF DESCRIPTION OF THE DRAWINGS

FIG. 3 provides a working example of some embodiments of FIG. 2's voltage regulator as a table of values at various nodes of the voltage regulator over one hundred successive clock cycles.

DETAILED DESCRIPTION

Figure 1:
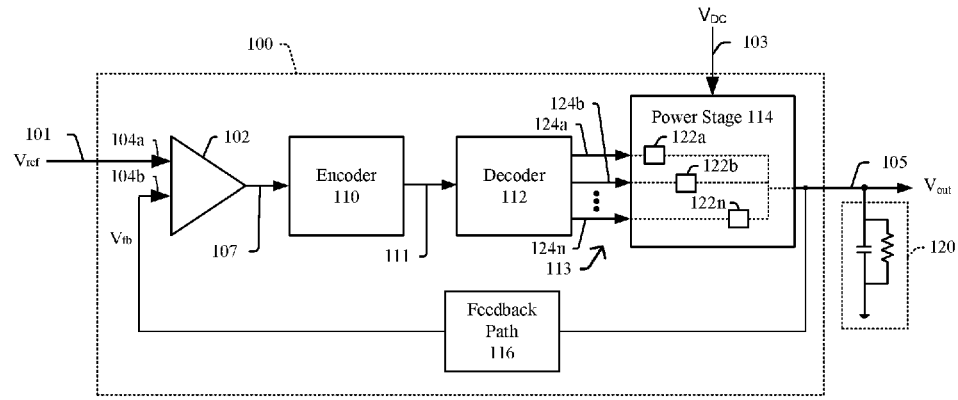
FIG. 1 is a block diagram of a voltage regulator in accordance with some embodiments.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

A voltage regulator is designed to use a power supply, such as a battery, to generate and maintain an output voltage that substantially tracks a reference voltage, even in the wake of dynamic operating conditions. For example, a voltage regulator can convert an initial DC supply voltage of 1.2 Volts (V) (e.g., as provided by a smart phone battery or a pre-regulator coupled to a smart phone battery) to an output voltage of 0.8 V which is suited to power integrated circuit (IC) chips within the smart phone. To limit possible damage and keep the IC chips operating within desired ranges, the output voltage of 0.8 V should be constant over time. However, because of dynamic operating conditions, such as changes in current demands of the IC chips, changes in temperature, changes in DC supply voltage of the battery, etc., the output voltage can exhibit undesirable fluctuations. Thus, the response of the voltage regulator is not always perfect in many regards.

The present disclosure relates to smart voltage regulation techniques. In some embodiments, the present disclosure relates to a voltage regulation system configured to utilize a encoder. The encoder is configured to receive an error signal, which is based on a comparison result of a reference voltage and a feedback voltage, and provides a multi-bit control signal based on the error signal. In some embodiments, the multi-bit control signal is generated by multiplying a present value of the error signal by a first pre-determined coefficient to provide a first result, and subtracting previous values of the error signal multiplied by other respective pre-determined coefficients from the first result. A decoder is employed to convert the multi-bit control signal to a plurality of control signals which are used to collectively generate an output voltage. By using this approach, the output voltage provided by the voltage regulator can more accurately track the reference voltage over a wide operating range.

FIG. 1 is a block diagram of a voltage regulator 100 in accordance with some embodiments. The voltage regulator 100 has a first input terminal 101 on which a reference voltage $V_{ref}$ is received, a second input terminal 103 on which a DC supply voltage $V_{DC}$ is received, and an output terminal 105 on which a regulated output voltage $V_{out}$ is generated and fed to a load 120. A feedback path 116 provides a feedback signal $V_{fb}$, which enables the voltage regulator to generate the output voltage $V_{out}$ from the DC supply voltage $V_{DC}$ in a manner that $V_{out}$ accurately tracks the reference voltage $V_{ref}$ over dynamic operating conditions, such as changes in load 120, changes in $V_{DC}$, changes in temperature, etc.

The voltage regulator 100 includes a comparator 102, an encoder 110, a decoder 112, and a power stage 114. The comparator 102 comprises a first comparison input 104a configured to receive a reference voltage $V_{ref}$, and a second comparison input 104b configured to receive a feedback voltage $V_{fb}$. The feedback path 116 couples an output of the power stage 114 to the second comparison input 104b. The comparator 102 compares the reference voltage $V_{ref}$ and the feedback voltage $V_{fb}$ and generates a comparison result as a digital error signal 107.

The encoder 110 is coupled to the output of the comparator 102 and is configured to provide a multi-bit digital control signal 111 based upon a present value of the digital error signal 107 and a plurality of previous values of the digital error signal 107. Multi-bit digital control signal 111 contains control information which induces changes in the power stage 114 in a way that tends to minimize differences between the feedback voltage $V_{fb}$ and the reference voltage $V_{ref}$. In this way, $V_{out}$ substantially tracks $V_{ref}$. In some embodiments, the encoder 110 gives the greatest weight to the present value of the digital error signal 107 by multiplying the present digital error signal 107 by a first pre-determined coefficient, and gives previous values of the digital error signal smaller weights by multiplying the previous values of the digital error signal by other respective pre-determined coefficients that are smaller than the first pre-determined coefficient. In some embodiments, the pre-determined coefficients corresponding to the previous values of digital error signal 107 can monotonically decrease according to lengths of their respective delays, so earlier values of the digital error signal 107 have smaller coefficients (i.e., smaller weights) and more recent values of the digital error signal have larger coefficients (i.e., larger weights).

The decoder 112 has a decoder input coupled to the output of the encoder 110 and is configured to generate a plurality of control signals 113 based on the multi-bit digital control signal 111. The control signals 113 are fed to the power stage 114 via a plurality of control lines 124a-124n.

The power stage 114 comprises a plurality of power cells 122a-122n, which are coupled to the DC supply voltage $V_{DC}$ and which receive the plurality of control signals 113 via the plurality of control lines 124a-124n, respectively. Thus, a first power cell 122a is coupled to the decoder 112 via a first control line 124a; a second power cell 122b is coupled to the decoder 112 via a second control line 124b; and so on. The outputs of the power cells 122a-122n are coupled together at the output terminal 105, so the power delivered by the power cells is summed at the output terminal 105.

During operation, the control signals 113 enable and disable the respective power cells 122a-122n to generate the output voltage $V_{out}$ to "track" the reference voltage, $V_{ref}$, despite changes in dynamic operating conditions. For example, in some embodiments, the power cells 122a-122n correspond to individual current sources whose outputs are coupled together at the output terminal 105. Thus, if the load 120 suddenly draws more current (e.g., due to a large number of devices within load 120 turning on simultaneously) and causes a corresponding drop in output voltage $V_{out}$, the feedback signal $V_{fb}$ will reflect this voltage drop, causing the digital error signal 107 to change state. Correspondingly, the encoder 110 changes the multi-bit digital control signal 111, causing the decoder 112 to correspondingly change the control signals 113. This change in the control signals 113 triggers an increase in the number of power cells 122a-122n turned on to increase current output from the power stage 114 to attempt to meet the demand of load 120 for increased current. Similarly, if the increase in current now provided to the load 120 overshoots the current needed by load 120, the output voltage $V_{out}$ may increase, as evidenced by a change in the feedback signal $V_{fb}$. This change in the feedback signal can alter the digital error signal 107, causing a corresponding change in the multi-bit digital control signal 111 and control signals 113, and ultimately triggering a decrease in current at output terminal 105. Feedback can continue in this manner to account for dynamic changes in the voltage regulator 100 and in the load 120 to keep the output signal $V_{out}$ substantially equal to the reference voltage $V_{ref}$ in some embodiments.

In other embodiments, rather than keeping the output signal $V_{out}$ substantially equal to the reference voltage $V_{ref}$, the output voltage $V_{out}$ can be offset by a substantially constant offset voltage from the reference voltage (e.g., $V_{out}=V_{ref}+V_{offset}$), or the output voltage $V_{out}$ can be a substantially constant multiple of the reference voltage (e.g., $V_{out}=V_m*V_{ref}$, where $V_m$ can be a positive or negative integer or can be a positive or negative fractional value whose magnitude can be greater than one or less than one.)

Figure 2:
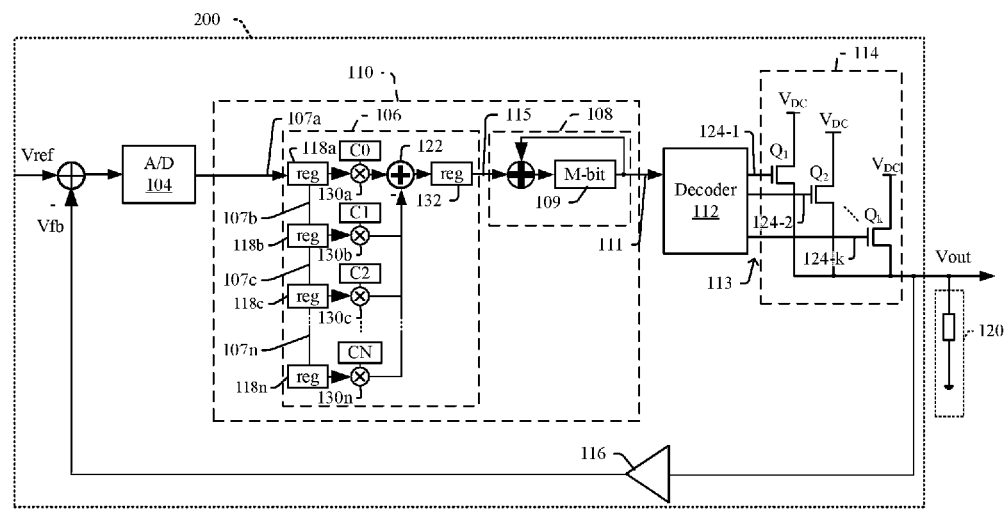
FIG. 2 is a block diagram illustrating a voltage regulator in accordance with some embodiments.

FIG. 2 is a more detailed block diagram illustrating a voltage regulation system 200 in accordance with some embodiments. As shown in FIG. 2, the voltage regulation system 200 comprises an analog-to-digital converter 104, an encoder 110, a decoder 112, a power stage 114, and a feedback path 116. These components are configured to use a DC supply voltage $V_{DC}$ to provide an output voltage $V_{out}$ that tracks a reference voltage $V_{ref}$, despite changes in dynamic operating conditions. As will be appreciated in more detail below, the encoder 110 includes an encoding unit 106 and an integrator 108. The encoding unit 106 is configured to store and process multiple delayed error signals and employs weighted present and delayed error signals so the output voltage $V_{out}$ tracks the reference voltage $V_{ref}$ to limit or minimize deviations between $V_{ref}$ and $V_{fb}$.

During operation a comparison result of the reference voltage $V_{ref}$ and the feedback voltage $V_{fb}$ is transmitted to the analog-to-digital converter 104 to generate a present digital error signal 107a, which is fed into the encoding unit 106. In some embodiments, the analog-to-digital converter 104 is a single bit analog-to-digital converter, which allows for faster signal processing. In some other embodiments, the analog-to-digital converter 104 is a multi-bit converter. For example, the analog-to-digital converter 104 can have two to four bits.

The encoding unit 106 comprises a plurality of registers 118a, 118b, and 118c to 118n, such as D-type flip-flops, other flip-flops, or other memory storage elements which are driven by a single clock. Because of the serial nature of these registers 118a-118n, the digital error values stored in the registers 118a-118n are delayed by successive numbers of clock cycles. Thus, the present digital error signal 107a is stored in a first register 118a, and a first multiplier 130a multiplies the present digital error signal 107a by a first pre-determined coefficient C0. The product of this multiplication is provided as an input to subtraction unit 122. A first delayed digital error signal 107b, which is delayed by one clock cycle relative to the present error signal 107a, is stored in a second register 118b, and a second multiplier 130b multiplies the first delayed digital error signal 107b by a second pre-determined coefficient C1. Similarly, a second delayed digital error signal 107c, which is delayed by two clock cycles relative to the present error signal 107a, is stored in a third register 118c, and a third multiplier 130c multiplies the second delayed digital error signal 107c by a third pre-determined coefficient C2. An integer number, N, of such delayed digital error signals can be stored in respective registers and multiplied by corresponding pre-determined coefficients, which can be the same or different from one another. The number "N" can be any integer value and can vary widely depending on design constraints. Weighted delayed digital error signals provided by multipliers 130b-130n are summed together, and the subtractor 122 subtracts the sum of the weighted delayed digital error signals provided by 130b-130n from the weighted present error signal provided by 130a. The result of this subtraction is stored in register 132.

The integrator 108 adds the current value stored in register 132 with a previous value stored in an M-bit register 109 to generate a multi-bit digital control signal 111 that is M-bits in length. In some embodiments, "M" equals to 32 or 64 for example, but other values of M are also contemplated as falling within the scope of the present disclosure.

The decoder 112 is coupled to the output of the integrator 108 and is configured to generate a plurality of control signals 113 based on the multi-bit digital control signal 111. The control signals 113 are fed to the power stage 114 via corresponding control lines 124-1 through 124-k.

The power stage 114 comprises a plurality of power cells which are coupled to a DC power supply $V_{DC}$ and which receive the control signals 113, respectively. The control signals 113 turn on or turn off the power cells in a manner to generate the output voltage $V_{out}$ to track the reference voltage $V_{ref}$. In some embodiments, each of the plurality of power cells comprises a respective MOSFET Q (e.g., $Q_1$, $Q_2 \ldots Q_k$) having a gate coupled to one of the plurality of control signals 113, a drain/source coupled to the DC power supply $V_{DC}$, and a source/drain coupled to the output voltage $V_{out}$ of the voltage regulator. The output voltage $V_{out}$ is then fed back to the analog-to-digital converter 104 through the feedback path 116 for further tuning. In some embodiments, an amplifier is arranged on the feedback path 116 and the output voltage $V_{out}$ is amplified before feeding to the input of the analog-to-digital converter 104. In some embodiments, the load 120 may have dramatic changes in current demand, changes in resistance, changes in capacitance, etc., over a short time interval during operation.

Figure 4A:
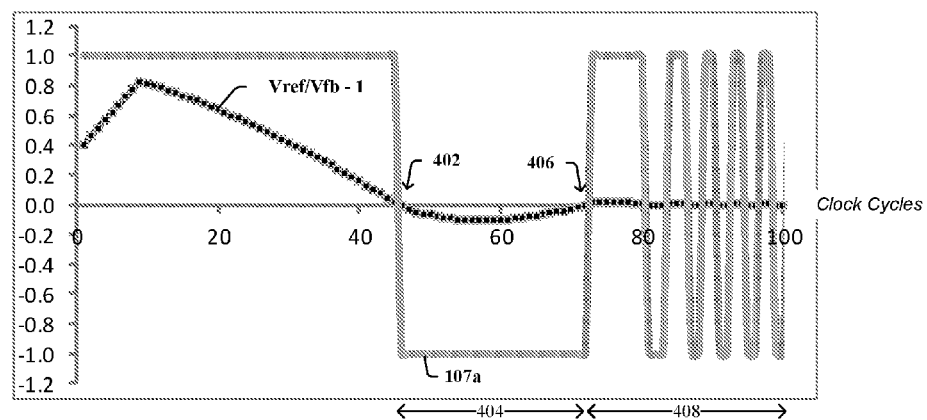
FIGS. 4A-4B are graphs consistent with FIG. 3's working example in accordance with some embodiments.
Figure 4B:
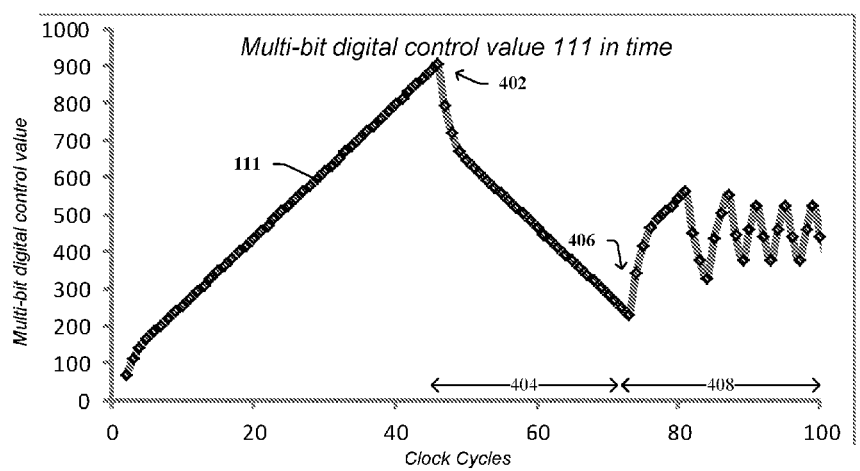

To describe detailed operation of FIG. 2's voltage regulator 200, a working example is now provided with regards to FIG. 3, which provides a table illustrating values at various nodes of the voltage regulator 200 over one-hundred successive clock cycles. This working example is for illustrative purposes only, and the present disclosure is not limited to the precise values contained in this example in any way. FIGS. 4A-4B, which will be described further herein, depict graphs which are consistent with FIGS. 3's working example.

As can be seen from the table in FIG. 3, this example illustrates a case where the encoding unit 106 includes six pre-determined coefficients (C0-C5). The first pre-determined coefficient C0, which corresponds to a weighting for the present digital error signal 107a, is set to 65 (see FIG. 3, 302); and second, third, fourth, and fifth pre-determined coefficients C1-C5, which correspond to weighting for previous states of the digital error signal, are set to 20, 12, 12, 2, and 1, respectively (see FIG. 3A, 304, 306, 308, 310, and 312, respectively).

During the first clock cycle 314, the present digital error signal 107a has a value of '1' (see 316), indicating that $V_{fb}$ is less than $V_{ref}$, for example. This could correspond, for example, to a time when the load 120 is suddenly demanding more current, and the voltage output $V_{out}$ correspondingly decreases. Hence, during this first clock cycle, the signal from the first multiplier 130a has a digital value of 65 (see 318), while the signals from the other multipliers 130b-130n remain at 0 (see 320), due to the delay for the present digital error signal to propagate through to the registers 118b-118n. Hence, at the end of the first clock cycle, the encoding unit output 115 provides a multi-bit digital value of 65 (i.e., 65−(0+0+0+0+0)). The integrator 108, which has been initialized to zero prior to the start of operation, hence outputs a multi-bit digital control value of 65 (see 322), which the decoder 112 will translate into appropriate control signals 113.

During the second clock cycle (324), the present digital error signal 107a still has a value of '1' (326), indicating that $V_{fb}$ is still less than $V_{ref}$ despite the updated control signals 113 provided in the first clock cycle (314). Hence, during the second clock cycle, the signal from the first multiplier 130a again has a digital value of 65 (1*65=65) (see 328), and now the signal from the second multiplier 130b has a digital value of 20 (1*20=20) (see 330), due to the error signal from the first clock cycle now propagating through to the second multiplier. The signals from the third-sixth multipliers remain at 0 (see 332), due to the continued delay for the digital error signal from the first clock cycle to propagate through to the registers 118c-118n. During the second clock cycle (324), the output of the encoding unit 115 is now 45 (334), which corresponds to the difference between the signal from the first multiplier 130a (328) and the signal from the other multipliers 130b-130n (62−(20+0+0+0+0)=45). The multi-bit digital control signal, which is output by the integrator 108, is the summation of the previous control signal 111 from the first clock cycle, plus the present output of the encoding unit (i.e., 65+45=110) (see 336). Thus, this multi-bit digital control signal for the second clock cycle has been further tuned in an attempt to induce an increase in current from the power stage 114 to minimize the difference between $V_{fb}$ and $V_{ref}$.

As can be seen from FIG. 3, during clock cycle 3 (338), the third multiplier now sees the digital error value from the first clock cycle, and multiples it by the third predetermined coefficient (12) (see 340). The encoding unit output 115 is again updated (342), and is equal the output of the first multiplier 130a (344) minus the sum of the other multipliers (346) (i.e., 65−(20+12+0+0+0)=33). The updated multi-bit digital control signal at 348, which is output by the integrator 108, is the summation of the previous control signal 111 from the second clock cycle, plus the present output of the encoding unit (i.e., 110+33=143). Thus, this multi-bit digital control signal 111 has again been tuned in the third clock cycle in an attempt to induce an increase in current from the power stage 114 to minimize the difference between $V_{fb}$ and $V_{ref}$.

Tuning continues in this manner, until eventually in clock cycle 46 (see 350) the present digital error signal 107a "flips" its state. As can be seen in FIG. 4A, clock cycle 46 corresponds to the time 402 at which $V_{fb}$ first meets or exceeds $V_{ref}$. In other words, time 402 is the point when $V_{ref}/V_{fb}-1$ crosses over a zero point in FIG. 4A. In fact, $V_{fb}$ "overshoots" $V_{ref}$ at this time 402. As can be seen in FIG. 4B, up until this time 402, the multi-bit control value 111 had been continuously increasing in an effort to induce the power stage to deliver additional current to the load 120. However, as can be seen by FIG. 4B, at time 402, the multi-bit digital control value 111 now decreases to attempt to correct the overshoot, indicating that the encoder is now commanding the power stage to reduce the current supplied to the voltage regulator output.

Still referring to FIGS. 4A-4B, during cycles 46-72 (404), the present error signal 107a remains at −1, and the multi-bit control value 111 is continually decreased in a continued effort to correct the overshoot. However, in cycle 73 (406), $V_{ref}/V_{fb}-1$ again crosses over the zero point in FIG. 4A, and the error signal 107 transitions back to +1. Also in cycle 73, the multi-bit digital control value 111 again starts to increase, this time in an effort to correct the "undershoot". Feedback continues in this way in an on-going manner for subsequent clock cycles 408. As can be seen in this example, by clock cycle 100, the multi-bit digital value 111 oscillates about some value to keep the voltage regulator in a stable state where $V_{ref}$ and $V_{fb}$ track one another very closely. As seen in FIG. 3, during these cycles (408), $V_{ref}/V_{fb}-1$ is approximately 0, meaning that $V_{ref}$ and $V_{fb}$ are substantially equal.

Figure 5:
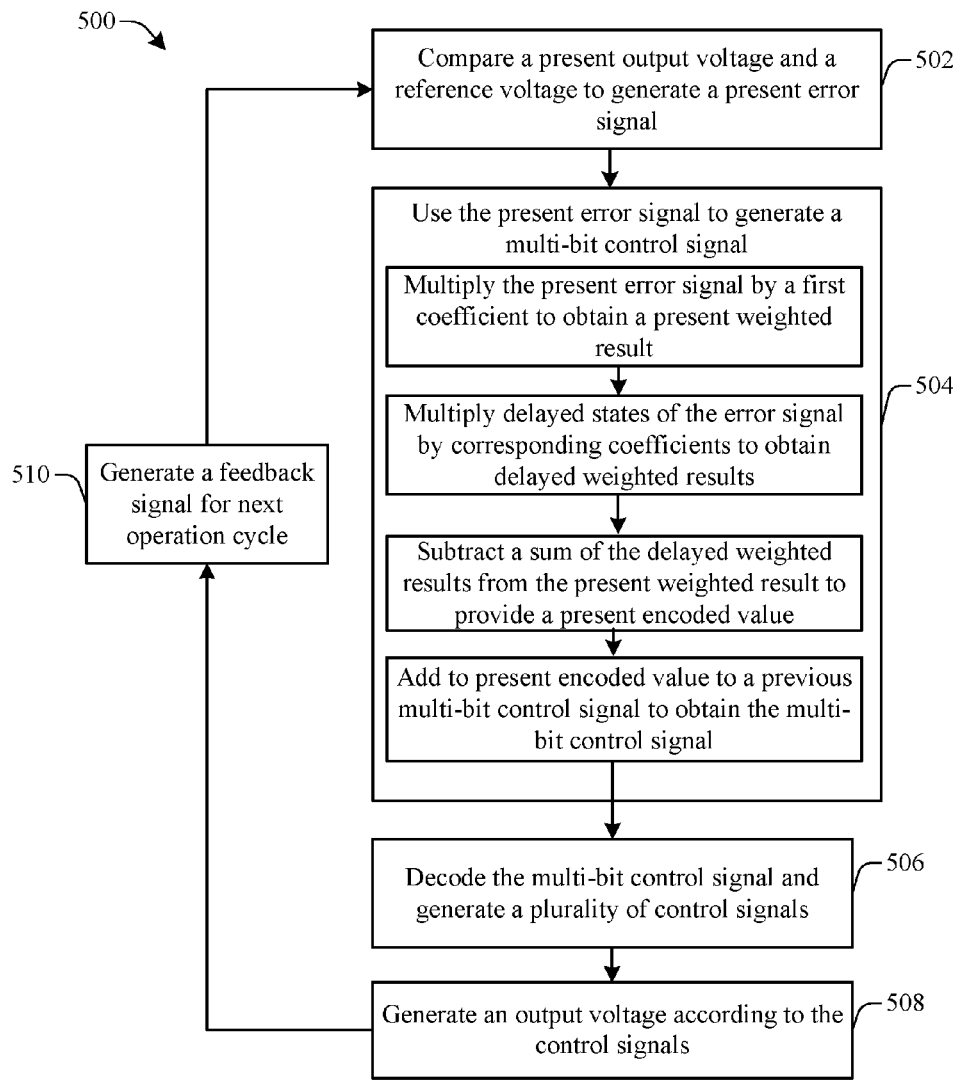
FIG. 5 is a flow diagram illustrating a method of voltage regulation in accordance with some embodiments.

FIG. 5 is a flow diagram illustrating a method 500 of digital voltage regulation in accordance with some embodiments. The method 500 encodes a present digital error signal employing weighted previous digital error signals to generate a control signal. The control signal controls an output voltage to track a reference voltage over a wide operating range.

The operation cycle starts at block 502, wherein a present output voltage and a reference voltage are compared to generate a present error signal. The present error signal contains difference information of the present output voltage and the reference voltage values.

At block 504, the present error signal is encoded to generate a multi-bit control signal. The present error signal is first multiplied by a first pre-determined coefficient to obtain a present weighted result. Then some previous error signals are respectively multiplied by corresponding pre-determined coefficients to obtain delayed weighted results. Then in some embodiments, the sum of delayed weighted results is subtracted from the present weighted result to generate a present encoding value. In some other embodiments, the present encoding value can be generated by summing some of the weighted results including the present weighted results and some of delayed weighted results and/or subtracting some other delayed weighted results. The encoding process can be optimized by adjusting pre-determined coefficients and the number of employed previous error signals depending on the design target for a given application. In some embodiments, the present encoded value is added to a previous multi-bit control signal, which can be stored in a register, to generate the present multi-bit control signal.

At block 506, the multi-bit control signal is decoded to generate a control signal. In some embodiments, the control signal comprises a plurality of control signals that respectively control switches of a number of power cells.

At block 508, a new output voltage is generated according to the control signal, so as to follow the reference voltage. In some embodiments, the new output voltage is collectively generated by power cells that receive a "turn on" control signal.

At block 510, a feedback signal is generated according to the new output voltage for next operation cycle. A similar process can be repeated from block 502 to block 510.

It will be appreciated that while reference is made throughout this document to exemplary structures in discussing aspects of methodologies described herein (e.g., the structure presented in FIG. 2, while discussing the example set forth in FIG. 3), that those methodologies are not to be limited by the corresponding structures presented. Rather, the methodologies (and structures) are to be considered independent of one another and able to stand alone and be practiced without regard to any of the particular aspects depicted in the Figures.

Also, equivalent alterations and/or modifications may occur to those skilled in the art based upon a reading and/or understanding of the specification and annexed drawings. The disclosure herein includes all such modifications and alterations and is generally not intended to be limited thereby. For example, although the figures provided herein, are illustrated and described to have a particular function block, it will be appreciated that alternative separate blocks may be utilized as will be appreciated by one of ordinary skill in the art.

Thus, the present disclosure relates to voltage regulation techniques. Voltage regulation systems or voltage regulation methods of some embodiments are disclosed. By employing an accumulation of weighted digital error signals at present and some previous operation cycles, the voltage regulation is performed in a digital world utilizing a very simple configuration. A wide power range, including different voltage domains and dramatic current change rate variation can be addressed universally without separate conditional routines or additional hardware. Also, response can be adjusted easily by changing weighting coefficient values, which makes design more flexible.

In some embodiments, the present disclosure relates to a voltage regulator for regulating an output voltage based on a reference voltage. The voltage regulator comprises an analog-to-digital converter, an encoder, a decoder and a power stage. The analog-to-digital converter is configured to provide a digital error signal based on the reference voltage and a feedback voltage on the feedback path. The encoder is coupled to the analog-to-digital converter and configured to provide a multi-bit digital control signal based upon a present value of the digital error signal, a plurality of pre-determined coefficients, and a plurality of previous values of the digital error signal. The decoder is coupled to the encoder and configured to generate a plurality of control signals based on the multi-bit digital control signal. The power stage comprises a plurality of power cells which are coupled to a power supply and which receive the plurality of control signals, respectively. The power cells have respective power cell outputs that are coupled together to collectively generate an output voltage based on the plurality of control signals.

In some other embodiments, the present disclosure relates to a voltage regulator. The voltage regulator comprises a comparator, an encoder, a decoder and a power stage. The comparator is configured to receive and compare a pre-determined reference voltage with a feedback voltage from an output of the voltage regulator and generate a digital error signal. The encoder is arranged after the comparator configured to generate a multi-bit digital control signal. The encoder is configured to multiple the digital error signal by a first pre-determined coefficient and subtract a sum of a plurality of delayed digital error signals multiplied by a plurality of pre-determined coefficients. The delayed digital error signals are generated by previous clock cycles and respectively stored in registers. The decoder is arranged after the encoder, configured to receive the multi-bit digital control signal and generate a plurality of control signals. The power stage comprises a plurality of power cells controlled by the plurality of control signals respectively, outputs of the power cells being coupled together to the output of the voltage regulator to generate an output voltage according to the plurality of control signals.

Still in some other embodiments, the present disclosure relates to a method of performing voltage regulation. The method comprises comparing a first output voltage of a voltage regulator with a reference voltage to generate a first digital error signal. The method further comprises encoding the first digital error signal by a plurality of delayed digital error signals generated from previous clock cycles and a plurality of coefficients to generate a collective digital signal. The method further comprises decoding the collective digital signal to a control signal and generating a second output voltage according to the control signal. The method further comprises feeding the second output voltage for a second cycle of comparison with the reference voltage.

While a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

What is claimed is:

1. A voltage regulator for regulating an output voltage based on a reference voltage, the voltage regulator comprising:

an analog-to-digital converter configured to provide a digital error signal based on the reference voltage and a feedback voltage on a feedback path;

an encoder coupled to an output of the analog-to-digital converter and configured to provide a multi-bit digital control signal based upon a present value of the digital error signal, a plurality of pre-determined coefficients, and a plurality of previous values of the digital error signal, wherein the encoder comprises:

a first multiplier configured to receive and multiply the present value of the digital error signal by a first pre-determined coefficient;

a first register configured to receive and store the present value of the digital error signal and output a previously stored first delayed digital error signal to a second register and a second multiplier, the second multiplier multiplies the first delayed digital error signal by a second pre-determined coefficient; and a subtractor configured to determine a difference between an output value of the first multiplier and an output value of the second multiplier;

a decoder coupled to the encoder, and configured to generate a plurality of control signals based on the multi-bit digital control signal; and a power stage comprising a plurality of power cells which are coupled to a power supply and which receive the plurality of control signals, respectively, wherein the power cells have respective power cell outputs that are coupled together to collectively generate an output voltage based on the plurality of control signals.

2. The voltage regulator of claim 1, the encoder further comprising:

a third multiplier configured to receive and multiply a second delayed digital error signal by a third pre-determined coefficient, wherein the second delayed digital error signal was previously stored in the second register and output by the second register;

a third register configured to receive and store the second delayed digital error signal and output a previously stored third delayed digital error signal to a fourth multiplier, the fourth multiplier multiplies the third delayed digital error signal by a fourth pre-determined coefficient; and wherein the subtractor is configured to subtract the output value of the first multiplier by the sum of the output value of the second multiplier, an output value of the third multiplier, and an output value of the fourth multiplier.

3. The voltage regulator of claim 2, wherein the analog-to-digital converter is a single bit converter.

4. The voltage regulator of claim 2, wherein the analog-to-digital converter has multiple bits.

5. The voltage regulator of claim 2, wherein the first pre-determined coefficient, the second pre-determined coefficient, the third pre-determined coefficient and the fourth pre-determined coefficient monotonically decrease.

6. The voltage regulator of claim 2, further comprising:

an integrator configured to receive and add an output of the subtractor to a previous stored digital signal and output the multi-bit digital control signal.

7. The voltage regulator of claim 1, wherein the multi-bit digital control signal increases when the digital error signal is positive and decreases when the digital error signal is negative.

8. The voltage regulator of claim 1, wherein each of the plurality of power cells comprises a MOSFET having a gate coupled to one of the plurality of control signals, a drain/source coupled to the power supply and a source/drain coupled to the output of the voltage regulator.

9. The voltage regulator of claim 1, further comprising:

an amplifier arranged on the feedback path and the output voltage is amplified before feeding to the analog-to-digital converter.

10. The voltage regulator of claim 1, wherein the first pre-determined coefficient is greater than the second pre-determined coefficient.

11. A voltage regulator comprising:

a comparator configured to receive and compare a pre-determined reference voltage with a feedback voltage from an output of the voltage regulator and generate a digital error signal;

an encoder coupled to an output of the comparator and configured to:

multiply the digital error signal by a first pre-determined coefficient, thereby providing a multiplied digital error signal;

multiply a plurality of delayed digital error signals by a plurality of pre-determined coefficients, respectively, thereby providing a multiplied plurality of delayed digital error signals; and store a difference between the multiplied digital error signal and a sum of the multiplied plurality of delayed digital error signals as a current value in a first register;

an integrator coupled to the output of the encoder and configured to generate a multi-bit digital control signal by accumulating the current value over time;

a decoder coupled to the integrator and configured to receive the multi-bit digital control signal and generate a plurality of control signals; and a power stage comprising a plurality of power cells controlled by the plurality of control signals respectively, outputs of the power cells being coupled together to the output of the voltage regulator to generate an output voltage according to the plurality of control signals.

12. The voltage regulator of claim 11, wherein a value of the multi-bit digital control signal is increased or decreased according to the digital error signal at an output of the comparator during a present clock cycle and a plurality of previous clock cycles.

13. The voltage regulator of claim 11, wherein the voltage regulator is integrated with a plurality of load circuits and powers the plurality of load circuits with different voltage or current ranges.

14. The voltage regulator of claim 13, wherein the load circuits respectively comprise a load logic configured to send a control signal to control the pre-determined reference voltage.

15. The voltage regulator of claim 11, wherein the feedback voltage is different from the output voltage of the voltage regulator.

16. The voltage regulator of claim 11, wherein the first pre-determined coefficient is different than the plurality of pre-determined coefficients, and wherein at least one of the plurality of pre-determined coefficients is different than at least one other of the plurality of pre-determined coefficients.

17. A method of voltage regulation, comprising:

comparing a first output voltage of a voltage regulator with a reference voltage to generate a first digital error signal;

encoding the first digital error signal by a plurality of delayed digital error signals generated from previous clock cycles and a plurality of coefficients to generate a present encoding value, wherein encoding the first digital error signal comprises:
  multiplying the first digital error signal by a first pre-determined coefficient to obtain a first present weighted result;
  multiplying a first delayed digital error signal by a second pre-determined coefficient to obtain a first delayed weighted result;
  multiplying a second delayed digital error signal by a third pre-determined coefficient to obtain a second delayed weighted result; and
  after respectively multiplying the first digital error signal and the first and second delayed digital error signals, subtracting the first and second delayed weighted results from the present weighted result to generate the present encoding value;
decoding the present encoding value to a plurality of control signals;
generating a second output voltage according to the control signals; and
feeding the second output voltage for a second cycle of comparison with the reference voltage.

18. The method of claim 17, after feeding the second output voltage for the second cycle of comparison with the reference voltage:
  comparing the second output voltage with the reference voltage to generate a second digital error signal;
  multiplying the second digital error signal by the first pre-determined coefficient to obtain a second present weighted result;
  multiplying the first digital error signal by the second pre-determined coefficient to obtain a third delayed weighted result;
  multiplying the first delayed digital error signal by the third pre-determined coefficient to obtain a fourth delayed weighted result;
  subtracting the third and fourth delayed weighted results from the second present weighted result to generate a second present encoding value; and
  generating a third output voltage according to the second present encoding value.

19. The method of claim 17, wherein generating a second output voltage according to the control signal comprises:
  turning on or off a number of power cells according to the control signals, the power cells having respective power cell outputs that are coupled together to collectively generate the second output voltage.

20. The method of claim 17, further comprising:
  adding the present encoding value to a previous multi-bit control signal stored in a register to obtain a present multi-bit control signal before decoding the present multi-bit control signal.

* * * * *